(12) United States Patent (10) Patent No.: US 9,070,538 B2
Shajii et al. (45) Date of Patent: Jun. 30, 2015

(54) PINCHED PLASMA BRIDGE FLOOD GUN FOR SUBSTRATE CHARGE NEUTRALIZATION

(71) Applicant: Varian Semiconductor Equipment Associates, Inc., Gloucester, MA (US)

(72) Inventors: Ali Shajii, Weston, MA (US); David Sonnenshein, Somerville, MA (US); Michael Kishinevsky, North Andover, MA (US); Andrew B. Cowe, Andover, MA (US); Gregory E. Stratoti, Haverhill, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 59 days.

(21) Appl. No.: 14/137,196

(22) Filed: Dec. 20, 2013

(65) Prior Publication Data

US 2015/0115796 A1 Apr. 30, 2015

Related U.S. Application Data

(60) Provisional application No. 61/895,787, filed on Oct. 25, 2013.

(51) Int. Cl.
  *H01J 37/30* (2006.01)
  *H01J 37/02* (2006.01)
  (Continued)

(52) U.S. Cl.
  CPC ..... *H01J 37/32623* (2013.01); *H01J 37/32412* (2013.01); *H01J 37/32174* (2013.01); *H01L 21/67213* (2013.01); *H01J 2237/3365* (2013.01); *H01J 2237/327* (2013.01)

(58) Field of Classification Search
  CPC .............. H01J 37/32412; H01J 37/026; H01J 37/3171; H01J 37/32082; H01J 37/321; H01J 37/08; H01J 1/16; H01J 27/022; H01L 21/2236; H01L 21/67115; C23C 14/48
  USPC ............. 250/492.21, 423 R, 288, 423 F, 424, 250/492.2; 438/513, 514, 495, 506, 508
  See application file for complete search history.

(56) References Cited

U.S. PATENT DOCUMENTS 4,188,591 A 2/1980 Siegman et al.
5,089,710 A * 2/1992 Kikuchi et al. ............ 250/492.3
(Continued)

FOREIGN PATENT DOCUMENTS

KR 10-2004-0005402 A 1/2004
KR 10-2005-0077169 A 8/2005

OTHER PUBLICATIONS

Hopwood, J., Review of Inductively Coupled Plasmas for Plasma Processing, Plasma Sources Science and Technology 1, 1992, 109-116, IOP Publishing Ltd.
(Continued)

*Primary Examiner* — David A Vanore

(57) ABSTRACT

A plasma flood gun for an ion implantation system includes an insulating block portion and first and second conductive block portions disposed on opposite sides of the insulating block portion. Conductive straps can be coupled between the first and second conductive block portions. The conductive block portions and the central body portion include recesses which form a closed loop plasma chamber. A power source is coupled to the conductive block portions for inductively coupling radio frequency electrical power into the closed loop plasma chamber to excite the gaseous substance to generate a plasma. The respective recess in the second conductive block portion includes a pinch region having a cross-sectional dimension that is smaller than a cross-sectional area of portion of the closed loop plasma chamber directly adjacent the pinch region. The pinch region can be positioned immediately adjacent an outlet portion formed in the second conductive block portion.

23 Claims, 12 Drawing Sheets

(51) Int. Cl.
*H01L 21/265* (2006.01)
*H01J 37/32* (2006.01)
*H01L 21/67* (2006.01)

(56) References Cited

U.S. PATENT DOCUMENTS

| | | | | |
|---|---|---|---|---|
| 5,399,871 | A * | 3/1995 | Ito et al. | 250/492.21 |
| 5,505,780 | A * | 4/1996 | Dalvie et al. | 118/723 MA |
| 6,020,592 | A * | 2/2000 | Liebert et al. | 250/492.21 |
| 6,204,508 | B1 * | 3/2001 | Chen et al. | 250/423 R |
| 6,488,825 | B1 * | 12/2002 | Hilliard | 204/298.06 |
| 6,645,354 | B1 * | 11/2003 | Gorokhovsky | 204/192.38 |
| 7,094,670 | B2 * | 8/2006 | Collins et al. | 438/513 |
| 7,288,491 | B2 * | 10/2007 | Collins et al. | 438/780 |
| 7,304,310 | B1 | 12/2007 | Shortt et al. | |
| 7,363,876 | B2 * | 4/2008 | Lai et al. | 118/723 I |
| 7,557,354 | B2 | 7/2009 | Okada | |
| 7,586,100 | B2 * | 9/2009 | Raj et al. | 250/423 R |
| 7,927,986 | B2 * | 4/2011 | Godet et al. | 438/513 |
| 8,603,591 | B2 * | 12/2013 | Godet et al. | 427/569 |
| 8,642,128 | B2 * | 2/2014 | Choi et al. | 427/255.395 |
| 8,697,552 | B2 * | 4/2014 | Adibi et al. | 438/511 |
| 8,997,688 | B2 * | 4/2015 | Adibi et al. | 118/723 R |
| 2006/0169912 | A1 | 8/2006 | Renau et al. | |
| 2009/0114815 | A1 * | 5/2009 | Vanderberg et al. | 250/288 |
| 2011/0061810 | A1 * | 3/2011 | Ganguly et al. | 156/345.27 |
| 2012/0085917 | A1 | 4/2012 | Kurunczi et al. | |
| 2013/0095643 | A1 * | 4/2013 | Santhanam et al. | 438/514 |
| 2013/0288469 | A1 * | 10/2013 | Sharma et al. | 438/527 |
| 2014/0076716 | A1 * | 3/2014 | Gorokhovsky et al. | 204/192.12 |
| 2014/0127394 | A1 * | 5/2014 | Gammel et al. | 427/8 |

OTHER PUBLICATIONS

Goldsborough, J.P., et al., RF Induction Excitation of CW Visible Laser Transitions in Ionized Gases, Applied Physics Letters, Mar. 15, 1966, pp. 137-139, vol. 8, No. 6, AIP on-line publishing.
Bell, W.E., Ring Discharge Excitation of Gas Ion Lasers, Applied Physics Letters, Oct. 1, 1965, pp. 190-191, vol. 7, No. 7, AIP on-line publishing.
International Search Report and Written Opinion Mailed Jan. 28, 2015 for PCT/US2014/061984 Filed Oct. 23, 2014.

* cited by examiner

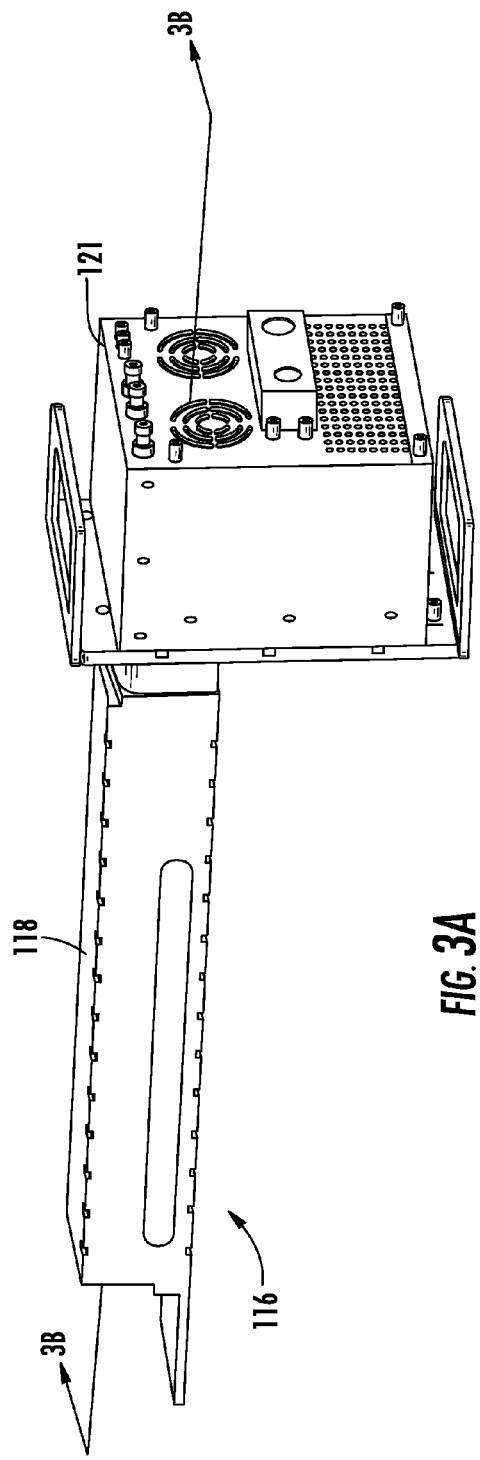
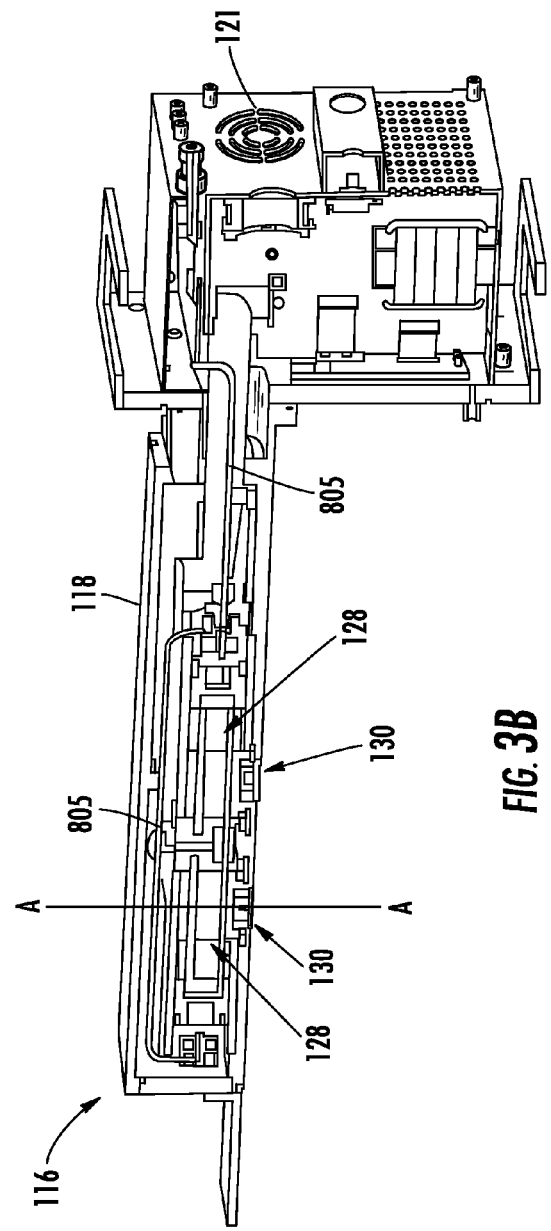
FIG. 3A
FIG. 3B

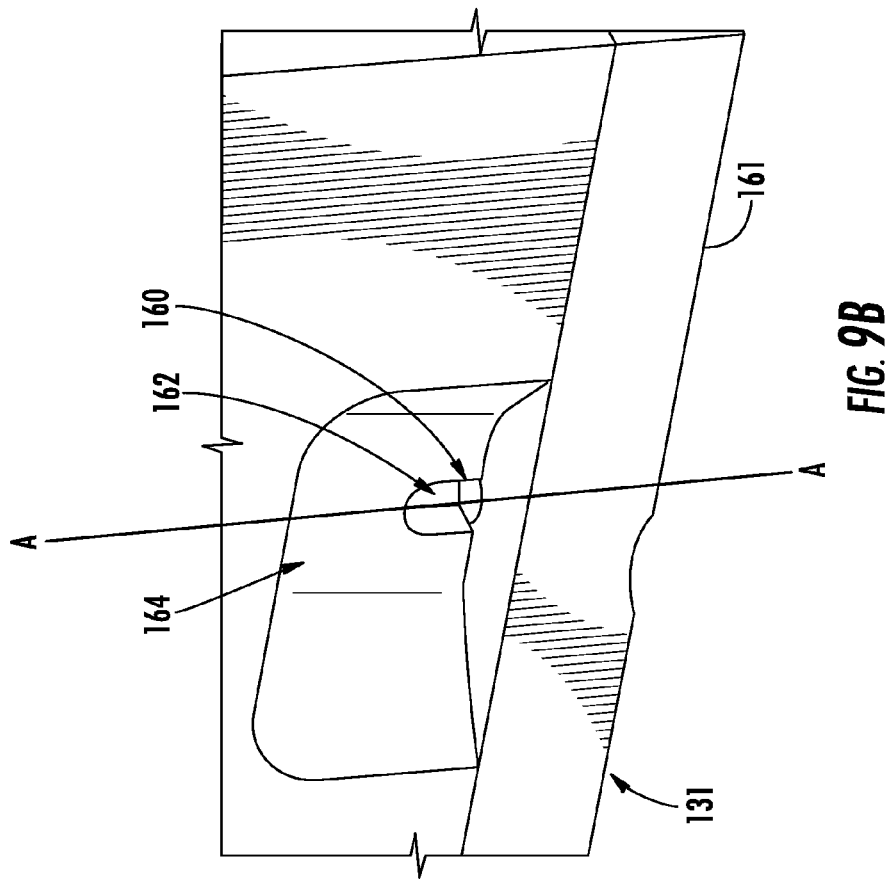
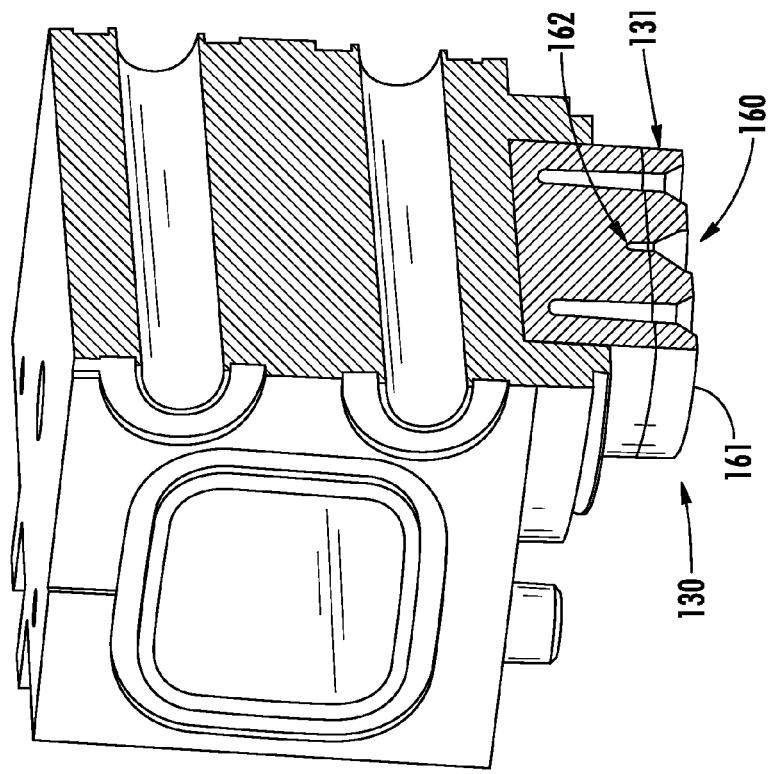
FIG. 9B
FIG. 9A

PINCHED PLASMA BRIDGE FLOOD GUN FOR SUBSTRATE CHARGE NEUTRALIZATION

CROSS-REFERENCE TO RELATED APPLICATIONS

This is a non-provisional of pending U.S. provisional patent application Ser. No. 61/895,787, titled "Pinched Plasma Bridge Flood Gun for Substrate Charge Neutralization," filed Oct. 25, 2013, the entirety of which application is incorporated by reference herein.

BACKGROUND OF THE INVENTION

1. Field of the Invention

Embodiments of the invention relate to the field of ion implantation of semiconductor structures. More particularly, the present invention relates to a plasma flood gun having a pinched outlet arrangement for generating and directing low energy plasma into contact with an ion beam.

2. Discussion of Related Art

Ion implantation is a process used to dope impurity ions into a substrate such as, for example, a semiconductor wafer. Generally, an ion beam is directed from an ion source chamber toward a substrate. Different feed gases are supplied to the ion source chamber to obtain plasma used to form ion beams having particular dopant characteristics. For example, from the feed gases $PH_3$, $BF_3$, or $AsH_3$, various atomic and molecular ions are created within the ion source, and subsequently accelerated and mass selected. The depth of implantation of the generated ions into the substrate is based on the ion implant energy and the mass of the ions. One or more types of ion species may be implanted in the target wafer or substrate in different doses and at different energy levels to obtain desired device characteristics. A precise doping profile in the substrate is critical to proper device operation.

During the implantation process, bombardment of positively charged ions on the target substrate may result in the build-up of a positive charge on insulated portions of the wafer surface and lead to positive potentials thereon. The energetic ions can also contribute to further wafer charging through secondary electron emission from the wafer. The resulting positive potentials can create strong electric fields in some miniature structures, causing permanent damage. A plasma flood gun (PFG) can be used to alleviate this charge buildup. In particular, a PFG may typically be located near the platen close to the incoming ion beam just before it makes its impact on a wafer or target substrate. The PFG often comprises a plasma chamber wherein a plasma is generated through ionization of atoms of an inert gas such as argon (Ar), xenon (Xe) or krypton (Kr). Low-energy electrons from the plasma are introduced into the ion beam and drawn towards the target wafer to neutralize the excessively positively charged wafer.

Existing PFGs suffer from a number of drawbacks. One significant drawback is that of metal contamination. In particular, certain conventional PFGs use a hot tungsten filament for plasma generation. During operation, the tungsten filament is gradually consumed and tungsten atoms may contaminate the ion implantation system as well as the process wafers. Another common source of metal contaminants is the PFG plasma chamber itself. The inner surface of the plasma chamber often contains one or more metals or metal compounds. Constant exposure of the inner surface to plasma discharge may free metal atoms into the ion implantation system. Metal electrodes or other metal components placed inside the plasma chamber may cause similar contaminations.

Although the contamination problem might be alleviated by constructing a plasma chamber substantially out of a dielectric material, such a solution may not be desirable because the nonconductive inner surface increases plasma potential and consequently affects the energy of the emitted electrons. For charge neutralization in an ion implantation system, a relatively low electron energy is generally preferred. Low energy electrons can readily be trapped within the positive electric potential of the ion beam and then travel within the beam towards a positively charged wafer. In comparison, excessively energetic electrons can escape from the beam and do not arrive at the wafer. Also, excessively energetic electrons, if they arrive at the wafer, can lead to net negative charging on the wafer surface. This can result in the build-up of excess negative charge on the wafer surface where the degree to which such a negative electrostatic charge can accumulate on the wafer surface is related to the energy of the electrons arriving at the wafer.

A further challenge in designing a PFG is to make it compact enough to fit into a predefined space reserved for an existing PFG without requiring substantial modifications to existing ion implantation systems. It is often economically unfeasible to modify a mature ion implantation system just to accommodate a new PFG. Thus, upgrading a PFG for an otherwise operable ion implanter requires a PFG design that can easily be retrofitted into current systems. Thus, there is a need to provide a PFG which overcomes the above-described inadequacies and shortcomings.

SUMMARY OF THE INVENTION

A plasma flood gun is disclosed for use in ion implantation system. The plasma flood gun may comprise an insulating block portion having a base portion and a central body portion, first and second conductive block portions disposed on the base portion and opposite sides of the central body portion, and a conductive strap coupling the first conductive block portion to the second conductive block portion. The first and second conductive block portions and the central body portion may include respective recesses formed therein which form a closed loop plasma chamber. The first and second conductive block portions may receive radio frequency (RF) electrical power to generate a plasma within the closed loop plasma chamber by exciting a gaseous substance. The respective recess in the second conductive block portion can include a pinch region having a cross-sectional dimension that is smaller than a cross-sectional dimension of a portion of the closed loop plasma chamber directly adjacent the pinch region. The pinch region can be positioned immediately adjacent an outlet portion having an outlet aperture.

A plasma loop assembly is disclosed for a plasma flood gun in ion implantation system. The plasma loop assembly can include an insulating block portion, and first and second conductive block portions disposed on opposite sides of the insulating block portion. The first and second conductive block portions and the insulating block portion may have respective recesses forming a closed loop plasma chamber. The plasma loop assembly may further include a conductive strap coupled between the first and second conductive block portions. The first and second conductive block portions can receive radio frequency (RF) electrical power to generate a plasma within the closed loop plasma chamber by exciting a gaseous substance. The respective recess in the second conductive block portion can include a pinch region positioned immediately adjacent an outlet aperture. The pinch region can be configured to allow easy transport of the plasma through the outlet aperture, which is sized to allow charged particles of the plasma to flow therethrough.

A plasma loop assembly is disclosed for materials processing applications. The plasma loop assembly can include an insulating block portion, and first and second conductive block portions disposed on opposite sides of the insulating block portion. The first and second conductive block portions and the insulating block portion can have respective recesses forming a closed loop plasma chamber. The respective recess in the second conductive block portion can include an outlet aperture sized to allow charged particles of the plasma to flow therethrough. The plasma loop assembly may further include a conductive strap coupling the first conductive block portion to the second conductive block portions. The first and second conductive block portions may receive radio frequency (RF) electrical power to generate a plasma within the closed loop plasma chamber by exciting a gaseous substance. The respective recess in at least one of the first conductive block portion, the second conductive block portion or the insulating block portion may be coupled to an outlet aperture.

BRIEF DESCRIPTION OF THE DRAWINGS

FIG. 3A is a rotated perspective view of the disclosed plasma flood gun of FIG. 2; FIG. 3B is a cross-section view of the disclosed plasma flood gun of FIG. 2, taken along line 3B-3B of FIG. 3A;

FIGS. 9A and 9B are partial cross-section views of an outlet portion of a plasma loop assembly of the plasma flood gun of FIG. 2;

DESCRIPTION OF EMBODIMENTS

Ion implanters are widely used in semiconductor manufacturing to selectively alter conductivity of materials. In a typical ion implanter, ions generated from an ion source are directed through a series of beam-line components that may include one or more analyzing magnets and a plurality of electrodes. The beam-line components select desired ion species, filter out contaminant species and ions having undesirable energies, and adjust ion beam quality at a target substrate. Suitably shaped electrodes may modify the energy and the shape of an ion beam.

Figure 1:
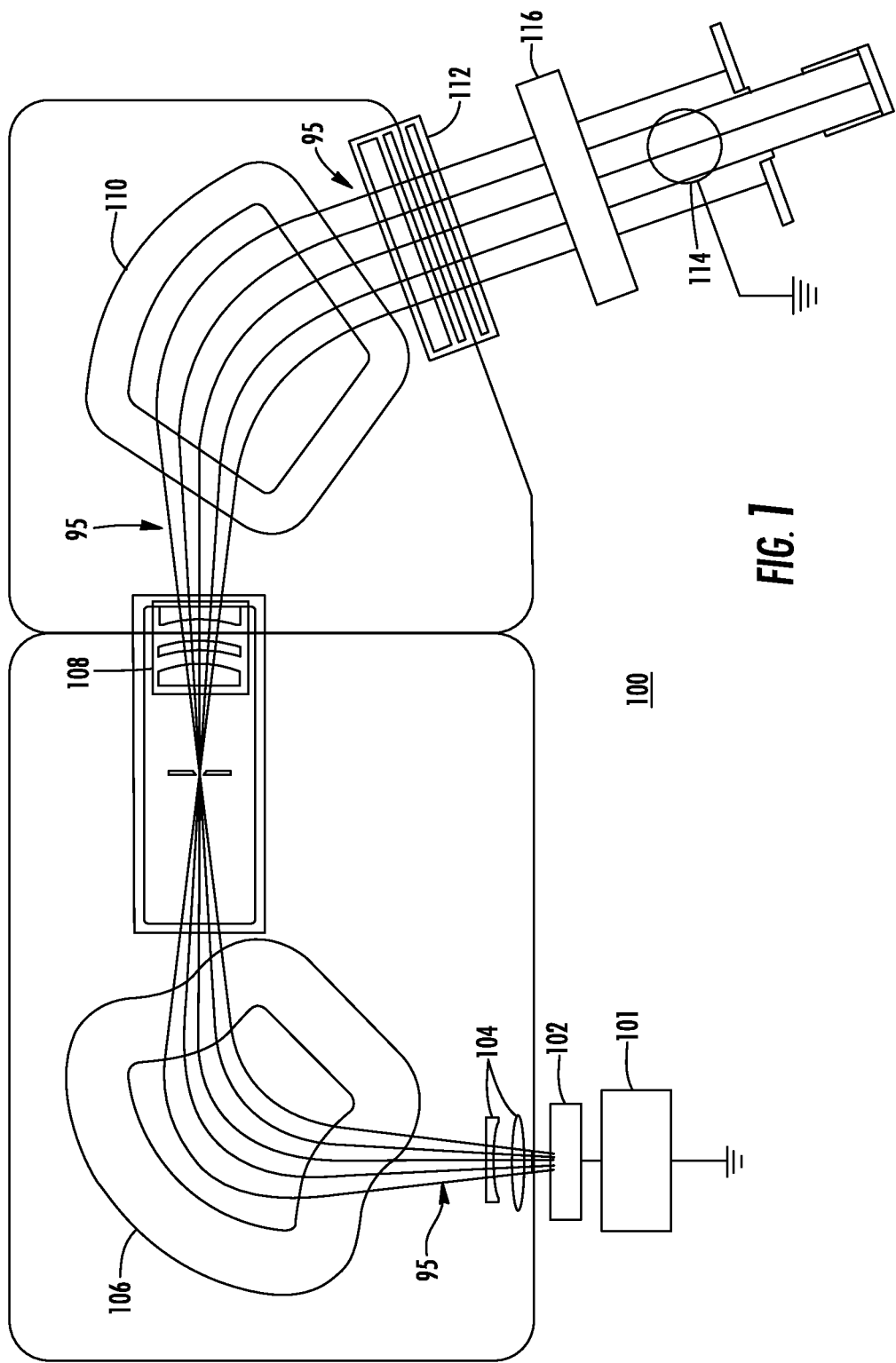
FIG. 1 depicts an ion implanter system incorporating the disclosed plasma flood gun in accordance with an embodiment of the present disclosure.

An exemplary high current ion implanter tool 100 is generally shown in FIG. 1 and includes an ion source chamber 102, and a series of beam line components that direct the ion beam to a substrate, which in one exemplary non-limiting embodiment may be a silicon wafer. These components are housed in a vacuum environment and configured to provide ion dose levels with high or low energy implantation based on the desired implant profile. In particular, implanter 100 includes an ion source chamber 102 to generate ions of a desired species. The chamber has an associated hot cathode powered by power supply 101 to ionize feed gas introduced into the chamber 102 to form a plasma, which comprises an ionized gas containing ions and free electrons. The hot cathode may be, for example, a heated filament or an indirectly heated cathode.

Different feed gases are supplied to the source chamber to generate ions having particular dopant characteristics. The ions may be extracted from source chamber 102 via a standard three (3) extraction electrode configuration used to create a desired electric field to focus ion beam 95 extracted from source chamber 102. Beam 95 passes through a mass analyzer chamber 106 having a magnet which functions to pass only ions having the desired charge-to-mass ratio to a resolving aperture. In particular, the analyzer magnet can include a curved path where beam 95 is exposed to the applied magnetic field which causes ions having the undesired charge-to-mass ratio to be deflected away from the beam path. Deceleration stage 108 (also referred to as a deceleration lens) may include a plurality of electrodes (e.g. three) with a defined aperture and is configured to output the ion beam 95. A magnet analyzer 110 is positioned downstream of deceleration stage 108 and is configured to deflect the ion beam 95 into a ribbon beam having parallel trajectories. A magnetic field may be used to adjust the deflection of the ions via a magnetic coil.

The ion beam 95 is targeted toward a work piece which is attached to a support or platen 114. An additional deceleration stage 112 may also be utilized which is disposed between collimator magnet chamber 110 and support 114. Deceleration stage 112 (also referred to as a deceleration lens) is positioned close to a target substrate on platen 114 and may include a plurality of electrodes (e.g. three) to implant the ions into the target substrate at a desired energy level. Because the ions lose energy when they collide with electrons and nuclei in the substrate, they come to rest at a desired depth within the substrate based on the acceleration energy. The ion beam may be distributed over the target substrate by beam scanning, by substrate movement using platen 114, or by a combination of beam scanning and substrate movement. A plasma flood gun (PFG) 116 can be positioned immediately upstream of the platen 114 to apply plasma to the ion beam just before the beam impacts the substrate. Although illustrated for use with the high current ion implanter 100 of FIG. 1, the PFG 116 may be utilized with other high current ion implanters and any other ion implanter such as medium current (MC) and high energy (HE) ion implanters.

Referring to FIGS. 2-5 an exemplary PFG 116 is shown which generally comprises a housing 118, a flange 120 positioned at a first end 122 of the housing, and first and second apertures 124, 126 from which positive ions and/or free electrons may emanate. The flange 120 may couple the PFG 116 to an appropriate control system 121 for controlling application of RF power, as will be described in greater detail later. As can be seen in FIGS. 3A and 3B, a pair of plasma loop assemblies 128 (FIGS. 4, 5) may be disposed within the housing 118, with an outlet portion 130 of each plasma loop assembly projecting within at least a portion of the first and second apertures 124, 126 so that plasma generated within the plasma loop assemblies can flow out of the outlets and into engagement with the ions of ion beam 95. Although the exemplary PFG 116 is illustrated as having a pair of plasma loop assemblies 128 and first and second apertures 124, 126, greater or fewer plasma loop assemblies and apertures can be used as desired, depending, for example, on a width of the ion beam 95.

Figure 4:
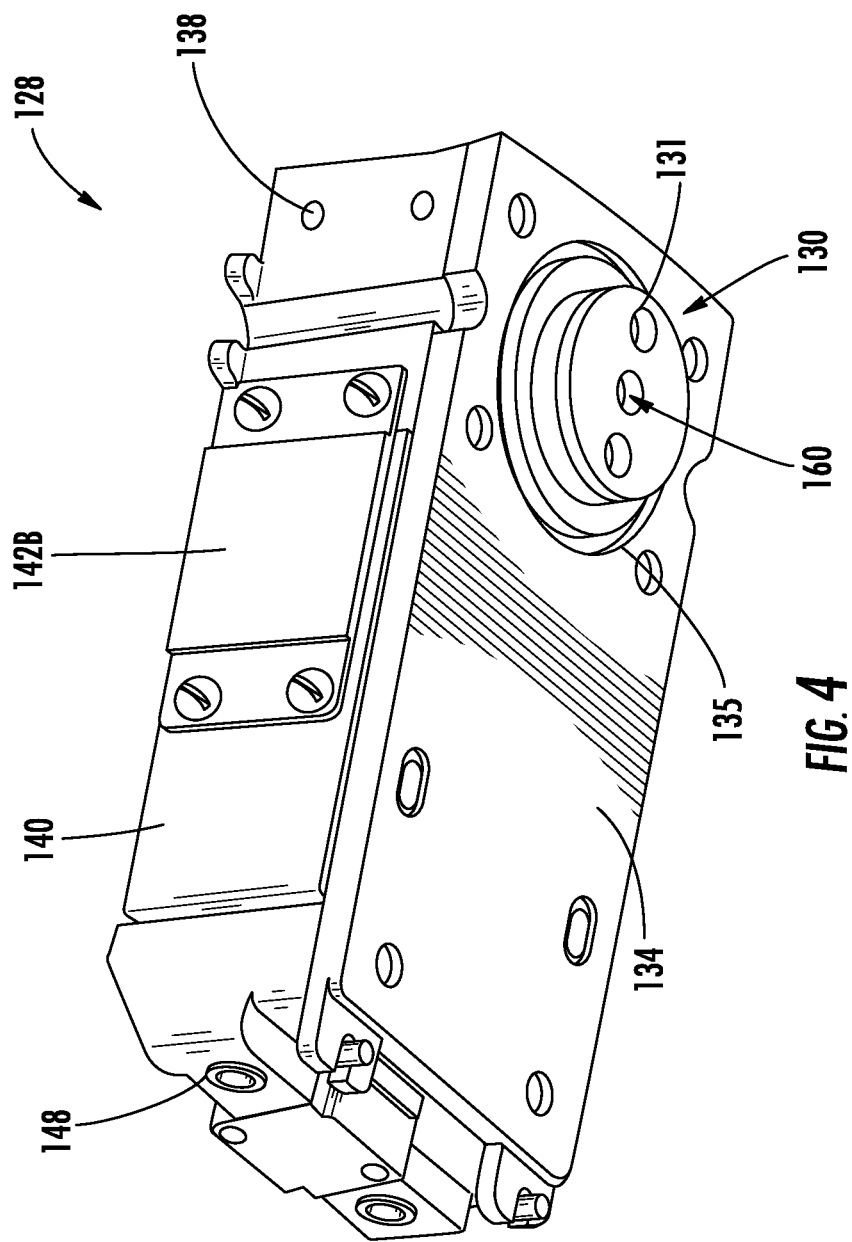
FIG. 4 is an isometric view of a portion of the disclosed plasma flood gun of FIG. 2.
Figure 5:
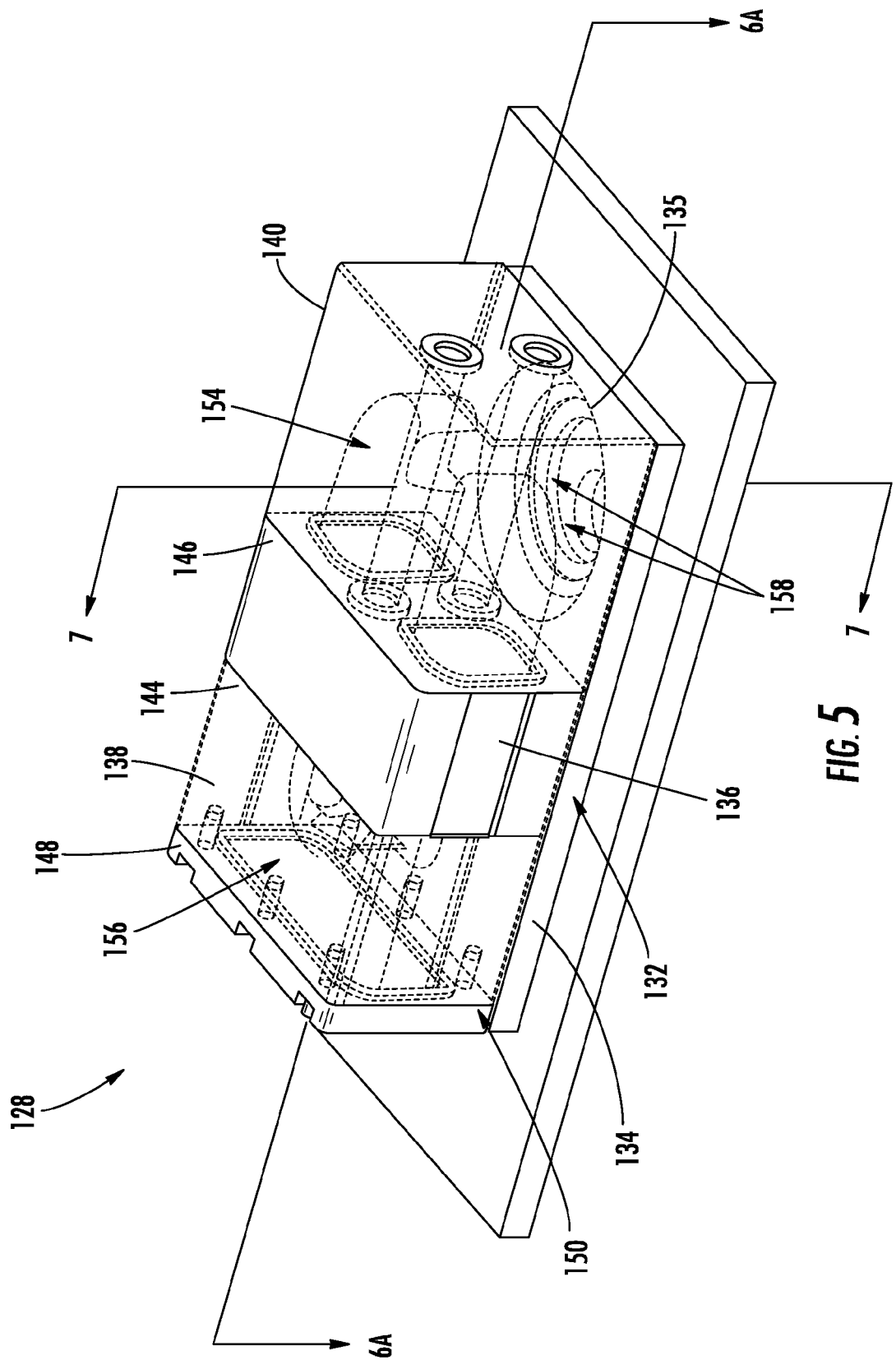
FIG. 5 is a reverse transparent isometric view of the portion of the disclosed plasma flood gun of FIG. 2.
Figure 6:
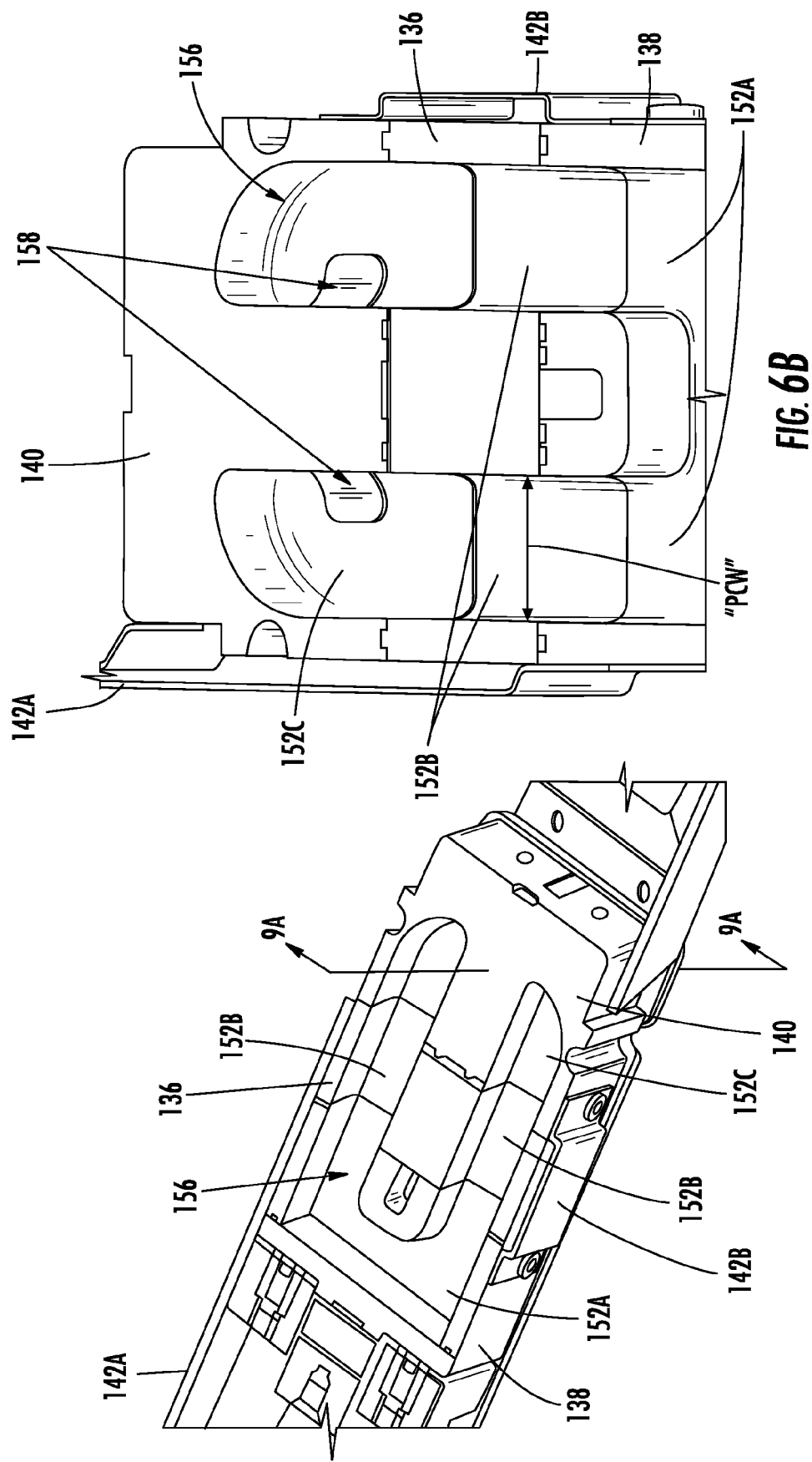
FIG. 6A is a cross-section view of the portion of the disclosed plasma flood gun of FIG. 2 taken along line 6A-6A of FIG. 5.
FIG. 6B is a rotated detail view of the cross-section of FIG. 6A.

Referring to FIGS. 4 and 5, an exemplary one of the plasma loop assemblies 128 includes an insulating block portion 132 having a base portion 134 and a central body portion 136, and first and second conductive block portions 138, 140 disposed on the base portion and on opposite sides of the central body portion. A pair of conductive straps 142A, B couple the first and second conductive block portions 138, 140 (as in FIGS. 6A and 6B), thereby bridging first and second sides 144, 146 of the central body portion 136 of the insulating block portion 132. One of the conductive straps 142A couples to the RF power supply 804 (FIG. 10), while the other conductive strap 142B bridges the first and second conductive block portions 138, 140 to complete the loop. An end cap 148 is provided on an end 150 of the first conductive block portion 138. In one non-limiting exemplary embodiment, the insulating block portion 132 comprises a ceramic. Non-limiting examples of appropriate ceramics include alumina, quartz, and boron nitride. The first and second conductive block portions 138, 140 and the end cap 148 may comprise aluminum, carbon (i.e., graphite) or other appropriate conductive material. In the illustrated embodiment, the individual elements are coupled together using suitable fasteners, such as cap screws. It will be appreciated, however, that this is not critical, and the connections between pieces can be made by brazing, using a suitable adhesive, or the like.

As can be seen in FIGS. 6A and 6B, the first and second conductive block portions 138, 140 and the central body portion 136 of the insulating block portion 132 have respective internal recesses 152A, B, C formed therein which, when the pieces are coupled together form a 3 dimensional closed loop plasma chamber 154. In the illustrated embodiment, the closed loop plasma chamber has a first portion 156 that is oriented in a plane parallel to the base portion 134 of the insulating block portion 132, and a second portion 158 that is orthogonal to the first portion when viewed from the side of the plasma loop assembly 128. In the illustrated embodiment, the first portion 156 forms a generally U-shaped chamber, although this is not critical and the first portion 156 can assume other shapes, such as V-shaped, half square, half rectangle, and the like.

The second portion 158 of the closed loop plasma chamber 154 is disposed in the second conductive block portion 140. A center region of the second portion 158 is disposed in the outlet portion 130 (FIG. 4) of the plasma loop assembly 128. In one embodiment the outlet portion 130 comprises an aperture plate 131. An outlet aperture 160 is provided in the aperture plate 131. As will be described in greater detail later, the outlet aperture 160 may be in communication with the second portion 158 of the closed loop plasma chamber 154. As can be seen in FIG. 4, the outlet portion 130, including aperture plate 131, of the plasma loop assembly 128 projects through an opening 135 in the base portion 134 of the insulation block portion 132. In operation, plasma generated within the closed loop plasma chamber 154 emanates from the outlet aperture 160 and charged particles from the emerging plasma may enter the region occupied by the adjacent ion beam 95.

Figure 7:
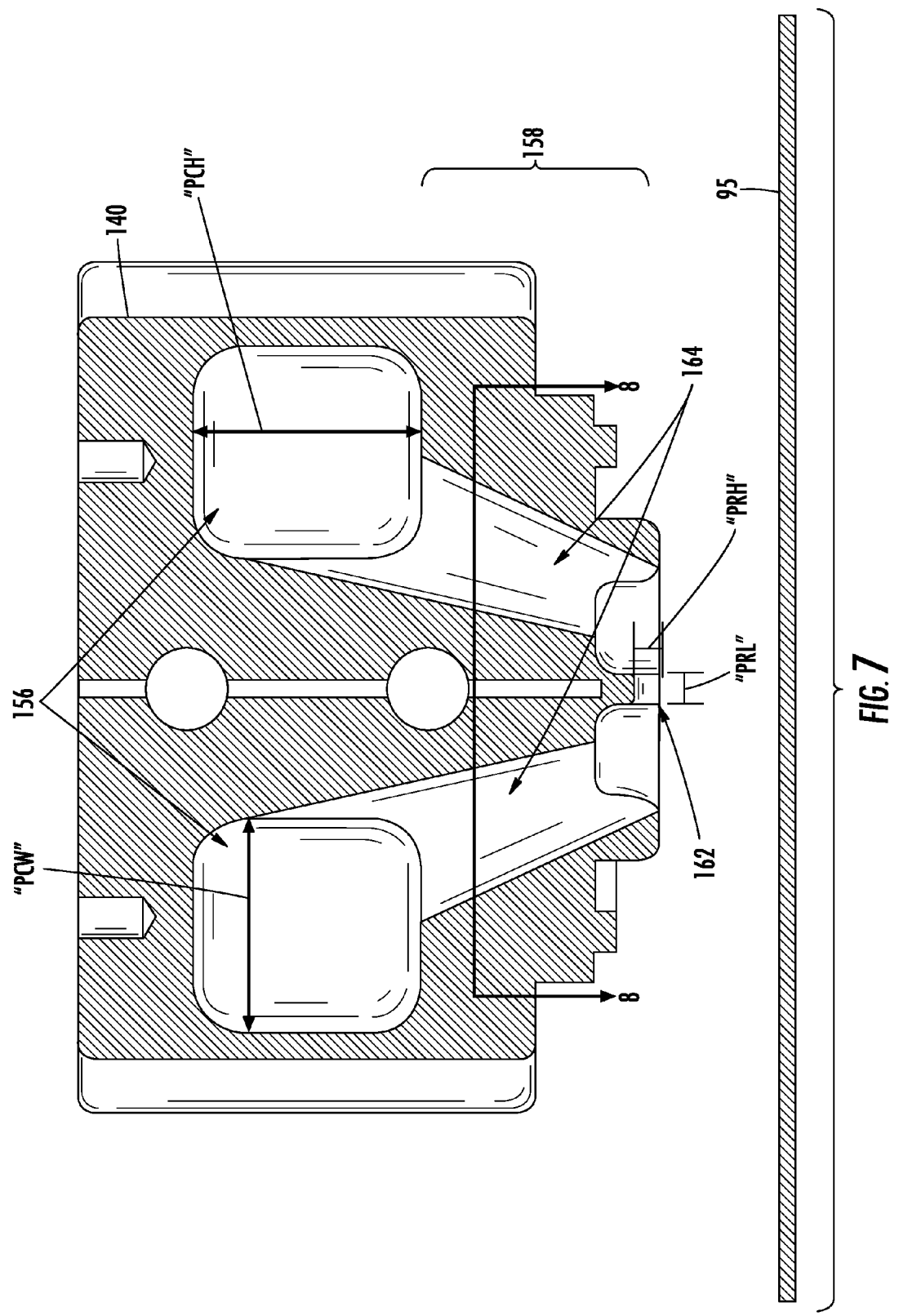
FIG. 7 is a cross-section view of the portion of the disclosed plasma flood gun of FIG. 2 taken along line 7-7 of FIG. 4.
Figure 8:
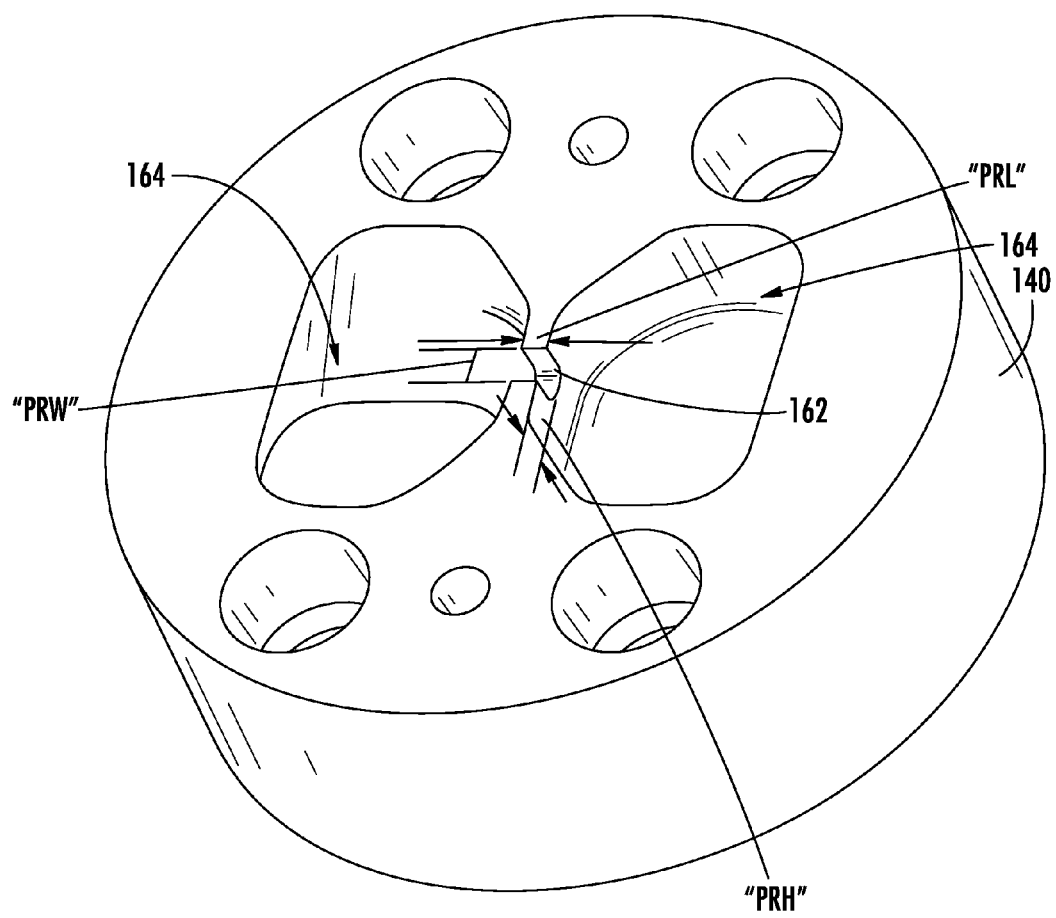
FIG. 8 is a bottom perspective view of a portion of the disclosed plasma flood gun of FIG. 2 which has been cut along line 8-8 of FIG. 7.

As shown in FIGS. 6B, 7 and 8, the first portion 156 of the closed loop plasma chamber 154 has a plasma chamber width "PCW" and a plasma chamber height "PCH." In the illustrated embodiment the plasma chamber width "PCW" and the plasma chamber height "PCH" are substantially equal, although this is not critical and in various embodiments the plasma chamber width "PCW" can be larger or smaller than the plasma chamber height "PCH". As can best be seen in FIG. 7, the second portion 158 of the closed loop plasma chamber 154 is generally necked-down from the first portion 156 to form a "pinch" region 162. FIG. 7 shows the arrangement of the pinch region 162 with the aperture plate 131 removed. When assembled, the pinch region 162 will be positioned adjacent to (i.e., directly over) the outlet aperture 160 in the aperture plate 131 (see FIGS. 9A, 9B) so that as the plasma is "squeezed" through the pinch region a portion of the plasma emerges through the outlet aperture 160.

As can be seen in FIG. 7, the second portion 158 of the closed loop plasma chamber 154 includes a pair of legs 164 which converge at the pinch region 162. The pair of legs 164 are oriented perpendicular to the first portion 156 of the closed loop plasma chamber 154 when viewed from the side of the plasma loop assembly 128. The pair of legs 164 are also oriented at oblique angles with respect to the first portion 156 of the closed loop plasma chamber 154 when viewed from the end of the plasma loop assembly 128, as can be seen in FIG. 7. FIG. 8 is a reverse perspective view of a portion of the second conductive block portion 140, including the pinch region 162. Again, for clarity the aperture plate 131 is not shown in this view. FIGS. 9A and 9B show the relative positioning of the aperture plate 131 with the outlet aperture 160 positioned directly adjacent to the pinch region 162. The pinch region 162 is shown as being positioned "over" the outlet aperture 160, thought it will be appreciated that the particular orientation is not critical and will depend, of course, on the orientation in which the PFG 116 is installed. For example, if the plasma loop assembly 128 is rotated 90-degrees from horizontal, the pinch region 162 may be located "beside" (though still adjacent) the outlet aperture 160. The ability to pick the orientation of the pinched region provides an advantage for compact packaging in existing systems.

As best seen in FIGS. 4 and 9a, the outlet aperture 160 has a conical shape with a relatively small diameter disposed directly adjacent to the pinch region 162 and a relatively larger diameter disposed on an outlet side 161 of the aperture plate 131. By providing a larger diameter at the outlet side 161 of the aperture plate 131 and a short length at the smallest diameter, more plasma can be transmitted into the ion beam region 95. The conical shape is not critical. For example, in lieu of a smooth conical section the outlet aperture 160 may have a series of steps or other shapes that result in the outlet aperture "opening up" quickly. In some embodiments, the outlet aperture 160 at the outlet side 161 is cylindrical, which opens below into a conical shape. The length of this cylindrical portion of the outlet aperture should be sufficiently thin to permit the plasma to "bulge" out. The outlet aperture 160 at the outlet side 161 can be a tapered oval in shape. The oval may run the width "PRW" of the pinch region 162. The oval may run perpendicular to the direction of travel of the ion beam 95 to maximize electron distribution across the width of the ion beam.

The pinch region 162 may, in some embodiments, comprise a generally U-shaped channel adjacent the outlet aperture 160. The pinch region 162 may have a pinch region height "PRH", a pinch region width "PRW" and a pinch region length "PRL" (FIGS. 7 and 8) which together define the size of the closed loop plasma chamber 154 in the pinch region. In some embodiments, the dimensions of the pinch region 162 the ratio of the cross-sectional size of the closed loop plasma chamber 154 in the pinch region to the cross-sectional size of the first portion 156 of the closed loop plasma chamber 154 is selected to optimize for more output or lower electron energy, as desired to suit a particular application. As can be seen in FIGS. 9A and 9B, the diameter of the outlet aperture 160 directly adjacent to the pinch region 162 is substantially equal to the pinch region width "PRW."

Thus, arranged, the first portion 156 of the closed loop plasma chamber 154 is in a plane perpendicular to the plane of the ion beam 95 in the ion beam's last transport stage to the substrate. The pinch region 162 is oriented perpendicular to the plane of the first portion 156 so that the outlet aperture 160 at the center of the pinch region 162 defines an axis A-A (FIGS. 3B & 9B) oriented perpendicular to the plane of the ion beam 95 (see FIG. 7, showing the pinch region 162 in relation to an exemplary ion beam cross-section). As a result, the orientation of the first and second portions 156, 158 result in a plasma loop (not shown) that is "bent" such that the portion of the plasma loop flowing through the pinch region 162 will be oriented in a plane perpendicular to that of the ion beam 95.

As previously noted, by providing the pinch region 162 adjacent to the outlet aperture 160, the plasma formed in the closed loop plasma chamber 154 emerges at its highest density and, therefore, maximizes the interaction between the plasma and the ion beam 95, enhancing "pulling" of the plasma from the closed loop plasma chamber.

It will be appreciated that orienting the first portion 156 of the closed loop plasma chamber 154 perpendicular to the second portion 158 facilitates a compact design for the plasma loop assembly 128, enabling it to be fit within existing PFG 116 enclosures.

Figure 10:
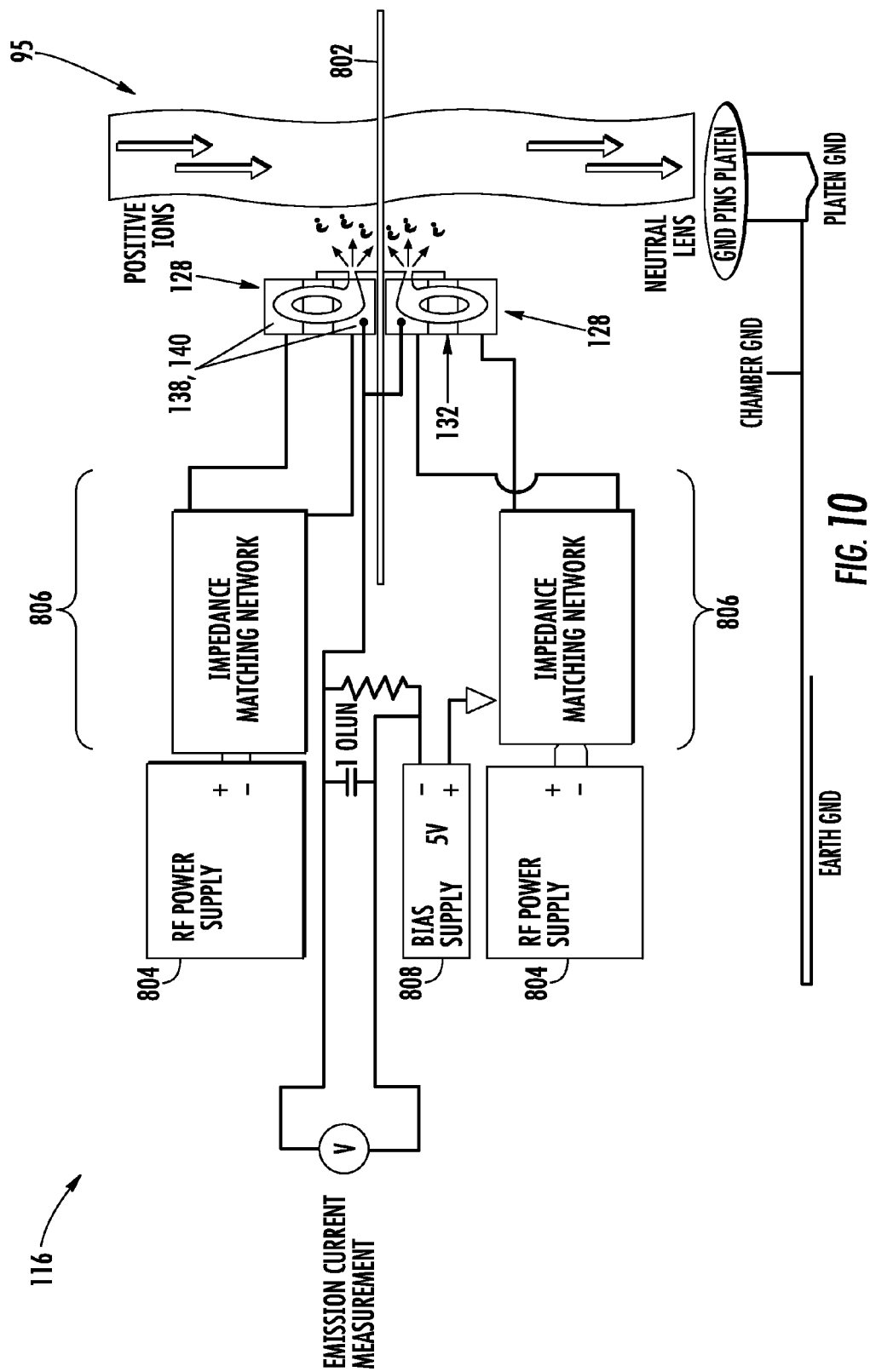
FIG. 10 is a schematic diagram of a portion of ion implanter system of FIG. 1 incorporating the disclosed plasma flood gun.

FIG. 10 is an exemplary functional schematic for the disclosed PFG 116. For clarity of illustration, an embodiment of the PFG 116 having a pair of plasma loop assemblies 128 is shown rotated 90 degrees from it actual position in relation to the ion beam 95 (i.e., rotated 90 degrees about the axis 802). As illustrated in FIG. 10, each plasma loop assembly 128 of the PFG 116 is coupled to a respective RF power supply 804. In particular, the conductive block portions 138, 140 of each plasma loop assembly 128 are coupled to a respective RF power supply 804 through a series connection to an impedance matching network 806. The physical coupling to the conductive block portions 138, 140 of each plasma loop assembly 128 is via conductive strap 142A, shown in FIGS. 6A and 6B.

The RF electrical power supplied by RF power supplies 804 may operate at typical frequencies allocated to industrial, scientific and medical (ISM) equipment, such as, for example, 2 MHz, 13.56 MHz and 27.12 MHz. The RF electrical power coupled to each plasma loop assembly 128 may excite the inert gases therein to generate a plasma. A feedthrough 805 (see FIG. 3B) may be provided in an end wall of the plasma loop assembly 128 through which one or more gaseous substances may be supplied to the plasma chamber. The gaseous substances may include inert gases such as xenon (Xe), argon (Ar) or Krypton (Kr). The gas pressure within in a plasma chamber may vary according to the regulated gas flow, the gas species, the racetrack dimensions, the pinch chamber dimensions and the output aperture size. Exemplary gas flow for some embodiments using Xe gas is between 0.05 and 5 sccm. In various embodiments, the gas pressure in the plasma chamber is such that the resulting gas pressure in a process chamber containing an ion beam to be supplied with electrons from the plasma chamber is $10^{-5}$ Torr or less without the ion beam present.

As further shown in FIG. 10 a bias supply 808 is coupled to the plasma flood gun 116 to bias the each plasma loop assembly 128 with respect to ground. For example, to optimize the neutralization of a substrate surface, a voltage of zero volts up to several volts may be supplied to enhance transport of electrons, but the bias supply may also be turned off when no benefit is available. Emission current from the plasma flood gun 116 may also be measured by a device connected to the bias supply 808 as shown and the bias voltage may be adjusted to output the desired electron current from the plasma flood gun 116.

Thus arranged, a plasma is sustained in the closed loop plasma chamber 154 by inductive coupling. Primary current travels through the first and second conductive block portions 138, 140 (and the pair of conductive straps 142) while the plasma current looping around the closed loop plasma chamber 154 forms the secondary current. It is to be noted that the plasma loop assembly 128 is configured to generate a continuous plasma loop that extends through the first and second portions 156, 158 and pinch region 162. The plasma emerging from the plasma loop assembly 128 is controlled by initial plasma boundary conditions (which are governed by the geometry of the pinch region 162 and the outlet aperture 160) as well as the fields present in the region of the ion beam 95 and substrate. RF power enters the closed loop plasma chamber 154 on one side and leaves via the other side of the closed loop plasma chamber. As noted, the central body portion 136 of the insulating block portion 132 is bridged by the pair of conductive straps 142 which channel the primary loop around the closed loop plasma chamber.

The use of the pinch region 162 and "flipped" geometry of the first and second portions 156, 158 of the closed loop plasma chamber 154 allows simultaneous optimization of electron energy, high plasma density and compact packaging in the tight space confines that are present near the substrate. The disclosed plasma loop assembly 128 can be used singly, as a dual set (as in the illustrated embodiments) or as a multiple group to cover scanned or ribbon beams for current substrate sizes, as well as wider beams expected in the future. The disclosed RF technology permits next generation reduction in metals contamination without sacrifice of charging performance and the plug-compatible nature of the resulting PFG 116 allows its use with external fields or devices that can further enhance yield.

Figure 11B:
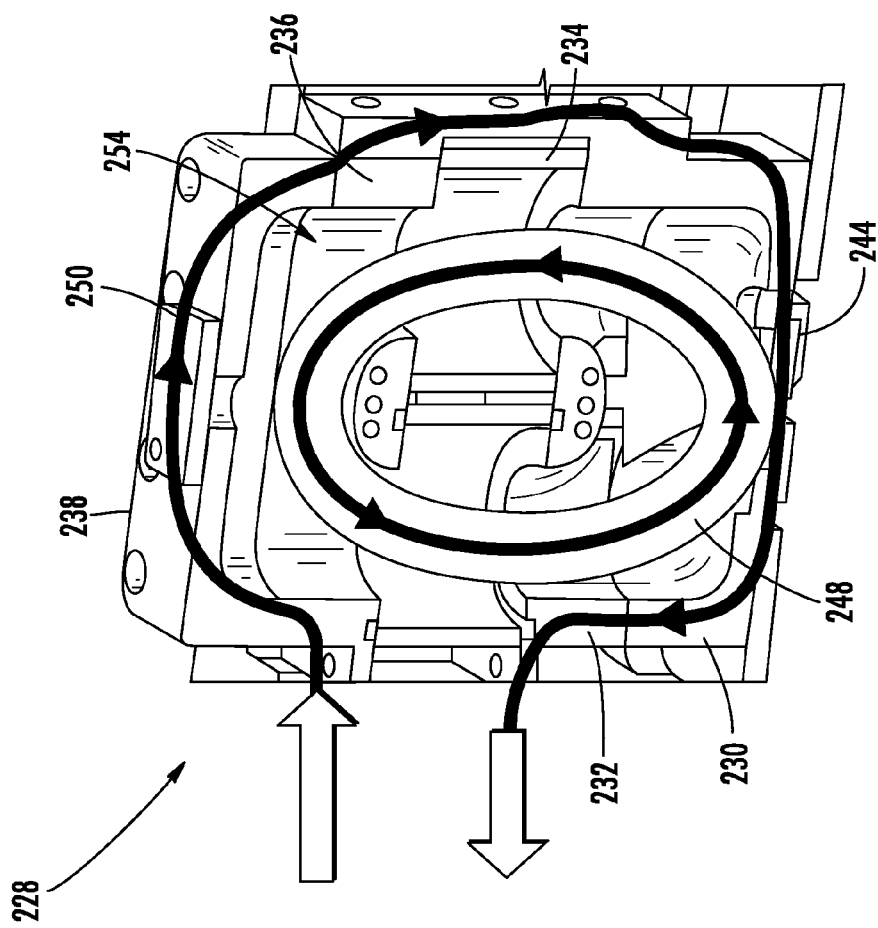
FIG. 11B is a cross-section view of the alternative plasma chamber arrangement of FIG. 11A taken along line 11B-11B of FIG. 11A.
Figure 11A:
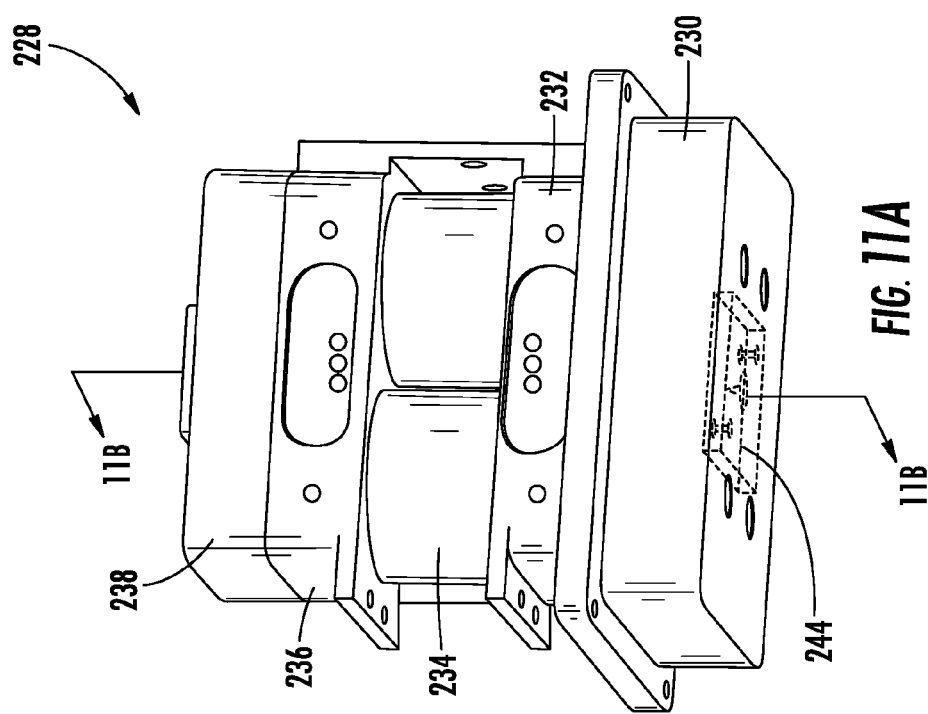
FIG. 11A is an isometric view of a portion of the disclosed plasma flood gun showing an alternative plasma chamber arrangement in accordance with an embodiment of the present disclosure.
Figure 12:
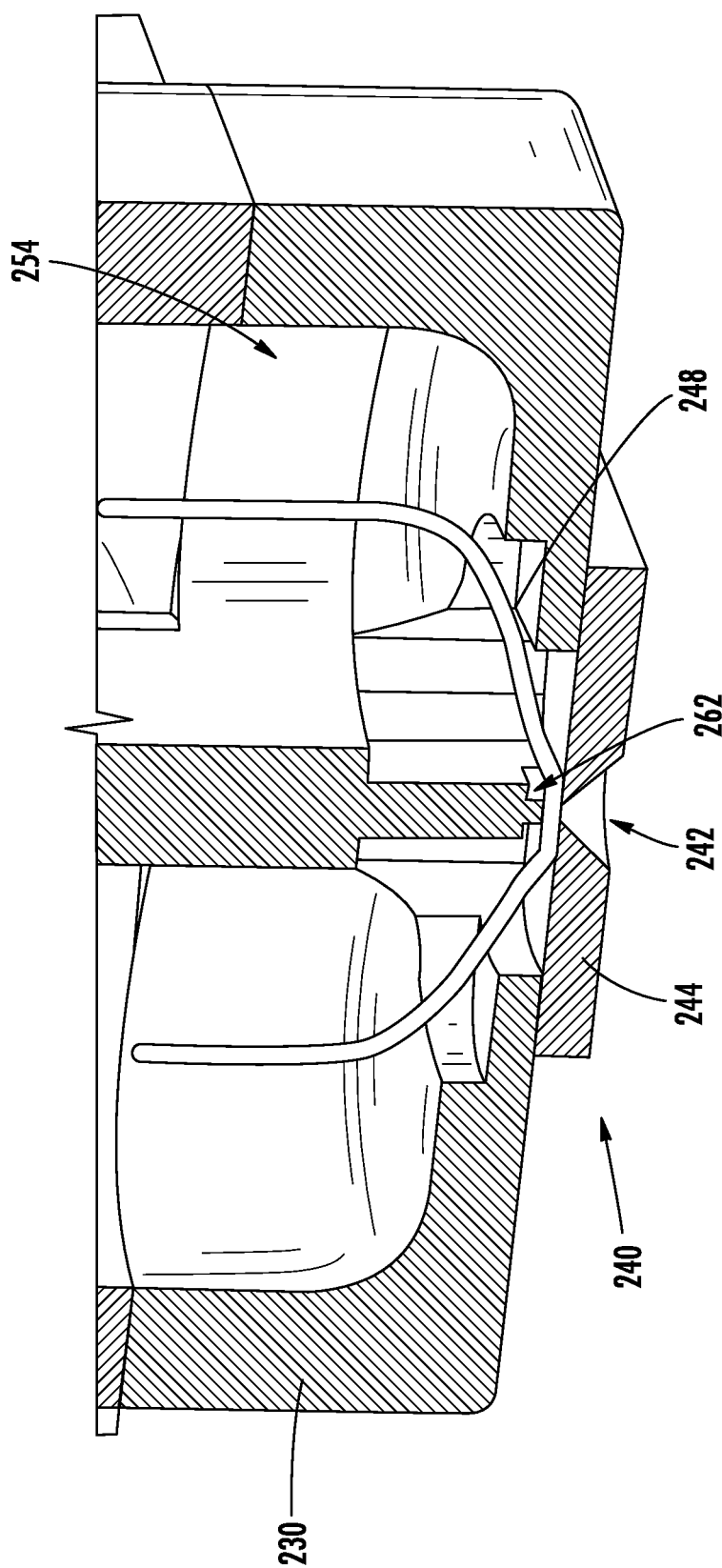
FIG. 12 is a detail view of a portion of the cross-section of FIG. 11B.

FIGS. 11A-12 disclose an alternative embodiment of a plasma loop assembly 228. The plasma loop assembly 228 of this embodiment comprises a plurality of stacked body portions including a base portion 230, a first conductive body portion 232 disposed on the base portion, an insulative body portion 234 disposed on the first conductive body portion, a second conductive body portion 236 disposed on the insulative body portion, and a cap portion 238 disposed on the second conductive body portion 236. Respective openings within each of the portions form a closed loop plasma chamber 254. The plasma loop assembly 228 includes an outlet portion 240 (FIG. 12) that has an outlet aperture 242 for enabling plasma generated in the closed loop plasma chamber 254 to emanate therefrom and enter the region of the ion beam 95. In the illustrated embodiment the outlet aperture 242 is formed in an aperture plate 244 disposed on the base portion 230. In the illustrated embodiment the outlet aperture 242 is in the form of an inverted cone to facilitate inter-engagement between the plasma and the ion beam 95.

The illustrated embodiment shows the aperture plate 244 as being a separate piece. Such an arrangement enables the aperture plate 244 to be removed for cleaning of the aperture plate and the pinch region 262 should deposits build up on their respective surfaces. In addition, the illustrated embodiment shows the insulative body portion 234 being comprised of a pair of discrete cylindrical members. The insulative body portion 234 may alternatively be provided as a unitary member.

The base portion 230 can include a pinch region 262 that includes any or all of the dimensions, shapes and/or other characteristics of the pinch region 162 described in relation to FIGS. 3A-9B. As can be seen best in FIGS. 11B and 12, the plasma loop assembly 228 is configured to generate a plasma loop 248, one end of which is forced to pass through the pinch region 262, directly adjacent the outlet aperture 242 in the aperture plate 244. Unlike the plasma loop formed with the plasma loop assembly 128 of FIGS. 3A-9B, the plasma loop 248 formed by plasma loop assembly 228 is generated in a single plane.

As previously noted, by providing the pinch region 262 adjacent to the aperture 242 and the opening 246 in the aperture plate 244, the design maximizes the portion of the highest density region of the plasma formed in the closed loop plasma chamber 254 which can emerge from the outlet aperture into the ion beam region 95.

Referring to FIG. 11B, an exemplary plasma loop 248 formed by the plasma loop assembly 228 is shown. As illustrated, a primary current path 250 is formed through the first and second conductive boy portions 232, 236 in a first direction (clock-wise) while the plasma loop 248 comprises a secondary current path 252 flowing in the opposite (counter-clockwise) direction. Notably, the depiction of the plasma loop 228 in FIGS. 11B and 12 is highly schematic and the actual width of the plasma loop 228 may be considerably less in the pinch region 262 as opposed to the plasma width in the rest of the plasma loop 248.

Figure 2:
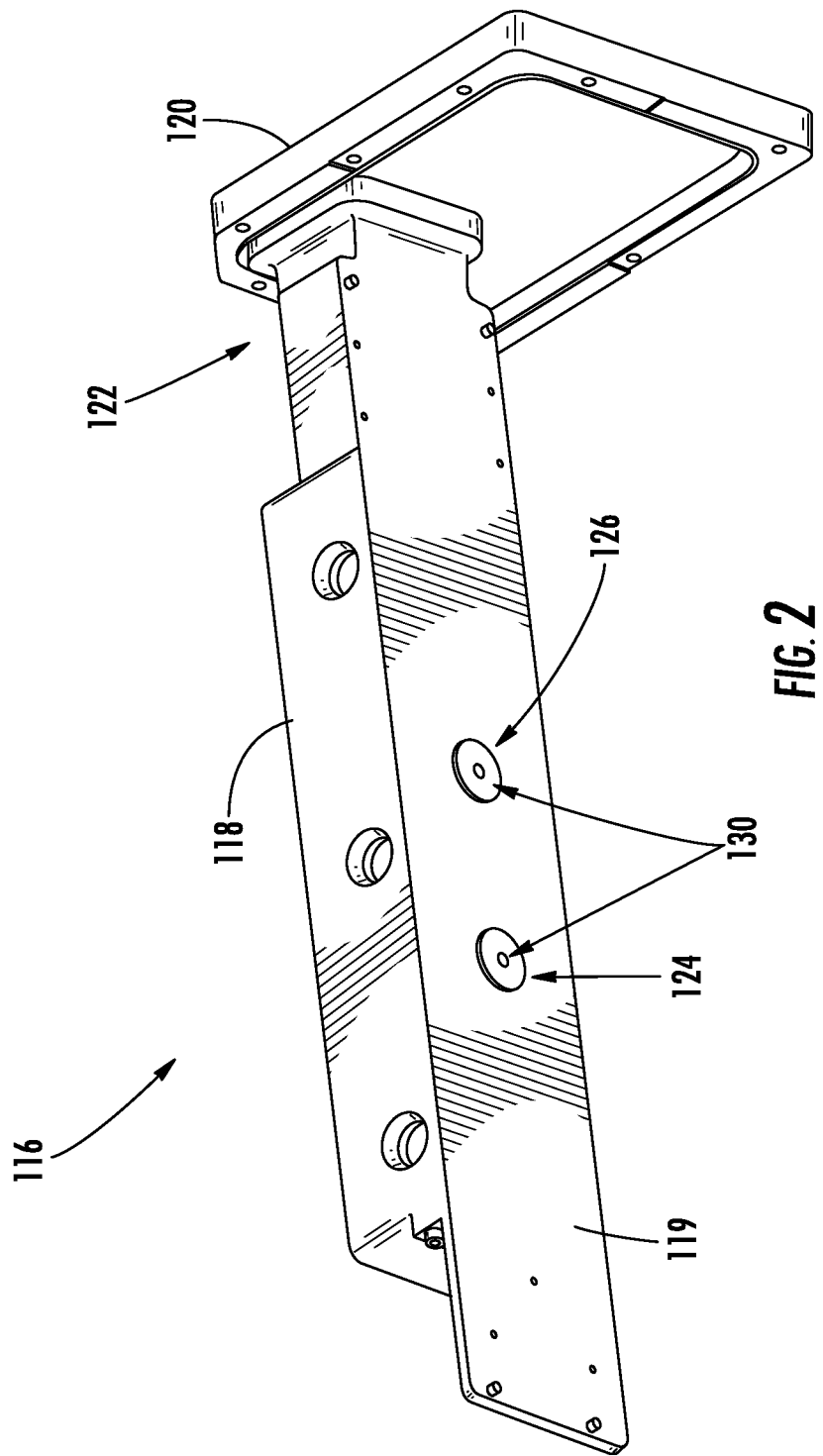
FIG. 2 is a perspective view of the disclosed plasma flood gun in accordance with an embodiment of the present disclosure.

FIG. 12 is a detail view showing the base portion 230, pinch region 262 and aperture plate 244, along with a representation of the flow of a portion of the plasma loop 248 through the pinch region 262. As can be seen, the pinch region 262 forces the plasma loop 248 downward (in the illustrated orientation) toward the outlet aperture 242 in the aperture plate 244. In the context of FIG. 2, the aperture plate 244 would be disposed through one of the first or second apertures 124, 126 in the housing 118 of the PFG 116.

In accordance with various embodiments of the disclosure, one or more plasma loop assemblies 228 may be coupled to a respective one or more RF power supplies as illustrated in FIG. 10. Thus the RF power supply 804 may be connected via the impedance matching network 806 to the first and second conductive block portions 232, 236 to generate a plasma therein.

In an ion implantation system, the PFG 116 is typically located near the ion beam 95 (FIG. 1) just before it reaches a target substrate disposed on platen 114. In a sidewall 119 of the housing 118, the outlet portions 130 of the plasma loop assemblies 128 are positioned to allow emerge into the ion beam region 95. As shown in FIG. 3B, a pair of outlet portions 130 associated with a pair of plasma loop assemblies 128 are disposed within the housing 118. It will be appreciated, however, that greater or fewer plasma loop assemblies 128 and outlet portions 130 may be provided across a width of the ion beam 95. For a ribbon-shaped ion beam, the pair of outlet portions 130 may be arranged to "cover" substantially the entire ribbon width. In the case of a scanned ion beam, the pair of outlet portions 130 may "cover" the scan width. According to one embodiment of the present disclosure, the pair of outlet portions 130 may be spaced to "cover" a width of 4-18 inches. Any of a variety of widths are achievable, as will be appreciated by one of ordinary skill in the art.

Although the PFG 116 has been described as having its pair of outlet portions 130 facing directly down on (i.e., perpendicular to) the ion beam 95, other orientations are also contemplated. Thus, in one embodiment the PFG 116 or the pair of outlet portions 130 may be tilted so that the plasma bridge joins the ion beam 95 at an angle. For example, the PFG 116 may be adapted so that electrons (or the plasma bridge) coming out of the pair of outlet portions 130 are directed in a general direction of a substrate and join the ion beam 95 at a 45 degree angle. Other angles can be used to optimize transport of substrate surface neutralization. Other methods of optimization, including the use of external magnetic or electric fields in the region outside PFG 116 may also be used to improve the transport of charged particles to the wafer surface from the emerging plasma.

In summary, the pinched plasma bridge flood guns of the present embodiments facilitates simultaneous adjusting of electron energy and plasma density in a compact housing that con be placed adjacent a substrate. In different embodiments, the compact flood architecture may include single, dual, or multiple plasma loop assemblies arranged in a linear fashion for directing electrons into an ion beam. This provides an architecture that may conveniently scale to cover any width of scanned or ribbon beams. The use of RF induction technology permits reduction in metals contamination without sacrificing the ability to generate sufficient electron current for neutralization.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A plasma flood gun for use in ion implantation system, the plasma flood gun comprising:

an insulating block portion having a base portion and a central body portion;

first and second conductive block portions disposed on the base portion and opposite sides of the central body portion; and a conductive strap coupling the first conductive block portion to the second conductive block portion;

the first and second conductive block portions and the central body portion including respective recesses formed therein which form a closed loop plasma chamber, wherein the first and second conductive block portions receive radio frequency (RF) electrical power to generate a plasma within the closed loop plasma chamber by exciting a gaseous substance; and wherein the respective recess in the second conductive block portion includes a pinch region having a cross-sectional dimension that is smaller than a cross-sectional dimension of a portion of the closed loop plasma chamber directly adjacent the pinch region, the pinch region positioned immediately adjacent an outlet portion having an outlet aperture.

2. The plasma flood gun according to claim 1, the closed loop plasma chamber comprising first and second portions, the first portion oriented parallel to the base portion of the insulating block portion, the second portion oriented perpendicular to the first portion.

3. The plasma flood gun according to claim 1, the pinch region disposed in the second portion of the closed loop plasma chamber.

4. The plasma flood gun according to claim 3, further comprising a housing with a housing aperture, the outlet portion comprising an aperture plate disposed within the housing aperture.

5. The plasma flood gun according to claim 1, the first portion of the closed loop plasma chamber comprising a U-shape.

6. The plasma flood gun according to claim 1, the second portion of the closed loop plasma chamber comprising a pair of legs which converge at the pinch region.

7. The plasma flood gun according to claim 1, wherein the gaseous substance comprises argon, krypton, xenon, or a mixture thereof.

8. The plasma flood gun according to claim 1, the closed loop plasma chamber interoperative with a power source supplying the RF electrical power to generate the plasma over a pressure range of 1-100 mTorr.

9. The plasma flood gun according to claim 1, comprising a bias source coupled to the first or second conductive block and configured to adjust electron emission from the plasma flood gun by adjusting voltage of the plasma flood gun with respect to ground.

10. The plasma flood gun according to claim 1, wherein the RF electrical power operates at a frequency of 13.56 MHz.

11. A plasma loop assembly for a plasma flood gun in ion implantation system, the plasma loop assembly comprising:
an insulating block portion, and first and second conductive block portions disposed on opposite sides of the insulating block portion, the first and second conductive block portions and the insulating block portion having respective recesses forming a closed loop plasma chamber; and
a conductive strap coupled between the first and second conductive block portions;
wherein the first and second conductive block portions receive radio frequency (RF) electrical power to generate a plasma within the closed loop plasma chamber by exciting a gaseous substance;
wherein the respective recess in the second conductive block portion includes a pinch region positioned immediately adjacent an outlet aperture, the pinch region configured to allow easy transport of the plasma through the outlet aperture, which is sized to allow charged particles of the plasma to flow therethrough.

12. The plasma loop assembly according to claim 11, the closed loop plasma chamber comprising first and second portions, the second portion oriented perpendicular to the first portion.

13. The plasma loop assembly according to claim 11, the pinch region comprising a U-shaped channel adjacent the outlet aperture, the outlet aperture disposed in an aperture plate, the outlet aperture having a conical cross-section.

14. The plasma loop assembly according to claim 11, the pinch region comprising a U-shaped channel adjacent the outlet aperture, the outlet aperture disposed in an aperture plate, the outlet aperture comprising a tapered oval slot.

15. The plasma loop assembly according to claim 11, the first portion of the closed loop plasma chamber comprising a U-shape.

16. The plasma loop assembly according to claim 11, the second portion of the closed loop plasma chamber comprising a pair of legs which converge at the pinch region.

17. The plasma loop assembly according to claim 11, the closed loop plasma chamber interoperative with a power source supplying the RF electrical power to generate the plasma over a pressure range of 1-100 mTorr.

18. A plasma loop assembly for materials processing applications, the plasma loop assembly comprising:
an insulating block portion, and first and second conductive block portions disposed on opposite sides of the insulating block portion, the first and second conductive block portions and the insulating block portion having respective recesses forming a closed loop plasma chamber, the respective recess in the second conductive block portion including an outlet aperture sized to allow charged particles of the plasma to flow therethrough; and
a conductive strap coupling the first conductive block portion to the second conductive block portions;
wherein the first and second conductive block portions receive radio frequency (RF) electrical power to generate a plasma within the closed loop plasma chamber by exciting a gaseous substance; and
wherein the respective recess in at least one of the first conductive block portion, the second conductive block portion or the insulating block portion is coupled to an outlet aperture.

19. The plasma loop assembly according to claim 18, the closed loop plasma chamber comprising first and second portions, the second portion oriented perpendicular to the first portion.

20. The plasma loop assembly according to claim 18, further comprising a pinch region positioned immediately adjacent the outlet aperture, the pinch region configured permit a maximum flow of plasma toward the outlet aperture.

21. The plasma loop assembly according to claim 20 the second portion of the closed loop plasma chamber comprising a pair of legs which converge at the pinch region.

22. The plasma loop assembly according to claim 18, the closed loop plasma chamber interoperative with a power source supplying the RF electrical power to generate the plasma over a pressure range of 1-100 mTorr.

23. The plasma loop assembly according to claim 18, wherein a power source supplying the RF electrical power is coupled to the first and second conductive block portions via the conductive strap.

* * * * *